Figure 1:
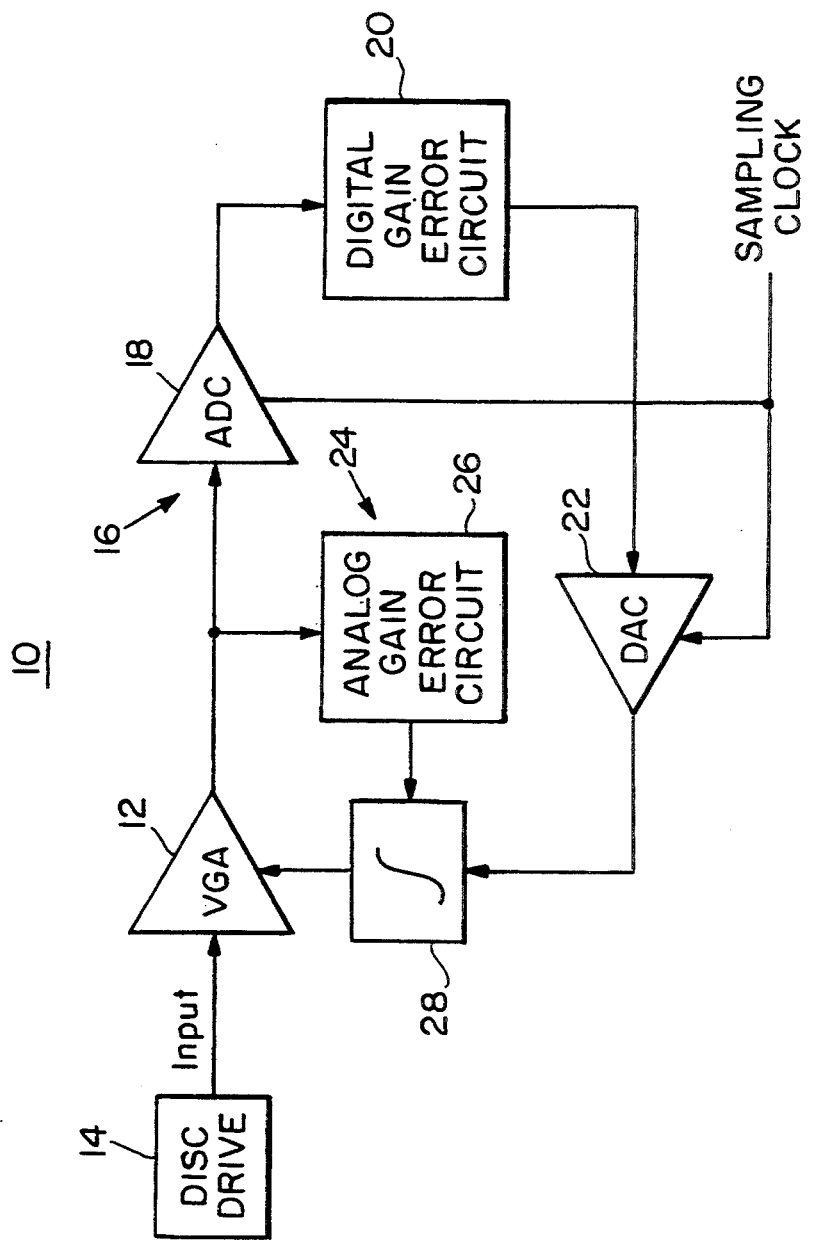

United States Patent [19]
Kovacs et al.

[11] Patent Number: 5,422,601
[45] Date of Patent: Jun. 6, 1995

[54] HYBRID ANALOG DIGITAL AUTOMATIC GAIN CONTROL GAIN RECOVERY SYSTEM

[75] Inventors: Janos Kovacs; Steven R. Robinson; Wyn Palmer, all of North Andover, Mass.

[73] Assignee: Analog Devices, Inc., Norwood, Mass.

[21] Appl. No.: 277,175

[22] Filed: Jul. 19, 1994

[51] Int. Cl.6 .............................................. H03G 3/30
[52] U.S. Cl. ...................................... 330/279; 330/134
[58] Field of Search ............... 330/129, 134, 278, 279; 360/46, 67

[56] References Cited
U.S. PATENT DOCUMENTS

| | | | |
|---|---|---|---|
| 4,750,058 | 6/1988 | Hirt et al. | 360/46 |
| 5,220,466 | 6/1993 | Coker et al. | 360/46 |
| 5,267,272 | 11/1993 | Cai et al. | 375/98 |

OTHER PUBLICATIONS

Philpott et al, "A 7 Mbyte/s (65 MHz), Mixed-Signal, Magnetic Recording Channel DSP Using Partial Response Signaling with Maximum Likelihood Detection", *IEEE Journal of Solid-State Circuits*, vol. 29, No. 3, Mar. 1994, pp. 177–184.

*Primary Examiner*—James B. Mullins
*Attorney, Agent, or Firm*—Joseph S. Iandiorio; Kirk Teska

[57] ABSTRACT

A hybrid analog/digital automatic gain control gain recovery system includes a variable gain amplifier (VGA) for receiving a variable amplitude input signal; a first AGC loop includes an analog to digital converter (DAC) for receiving the analog input signal and converting it to a digital signal; a digital gain error detection circuit for detecting variations of the digital signal in a first range and generating a digital error correction signal; and a digital to analog converter (DAC) for converting the digital error correction signal to a first analog correction signal; a second analog AGC loop includes an analog gain error detection circuit, responsive to variations in the output of the VGA in a second range greater than the first range for generating a second analog correction signal; and an integrator circuit responsive to the first and second analog correction signals for providing to the VGA a control signal to adjust the gain of the VGA to accommodate variations in the input signal amplitude.

14 Claims, 2 Drawing Sheets

HYBRID ANALOG DIGITAL AUTOMATIC GAIN CONTROL GAIN RECOVERY SYSTEM

FIELD OF INVENTION

This invention relates to a hybrid analog/digital automatic gain control (AGC) recovery system, and more particularly to such a system which employs an analog acquisition loop in combination with a digital tracking loop to control the gain.

BACKGROUND OF INVENTION

Conventional read out circuits for computer disc drives must detect low level analog input signals which may vary by orders of magnitude and settle those signals as quickly as possible to within a nominal range for submission to analog to digital converters (ADC) and subsequent digital processing. Because a finite time is required to settle the signal, each data field on the disc is formatted with a tracking zone or preamble field ahead of the data field to provide sufficient time for the signal to be brought within the nominal range. Since the preamble field occupies space on the disc that could be used to store data, faster settling is desirable to increase usable disc capacity. One attempt to improve performance uses two digital loops, an acquisition loop and a tracking loop. These loops sense deviations in the signal and feed back a correction signal to a variable gain adjustment amplifier to compensate for variations in the input signal. The acquisition loop adjusts for large input signal variations such as occur initially when a read command is received. The tracking loop adjusts for small signal variations as occur during operation. Such digital dual loop systems offer satisfactory performance but have certain shortcomings. The acquisition loop is relatively long and so its response time is not as short as would be desirable. Further, since the acquisition loop is digital the sampling of the analog input signal by the ADC must be carefully timed to insure that variations in amplitude that would require gain adjustment are true amplitude variations in the input signal and not merely phase or sampling shifts. This requires substantial additional complex circuitry.

SUMMARY OF INVENTION

It is therefore an object of this invention to provide an improved hybrid analog/digital automatic gain control circuit (AGC) gain recovery system.

It is a further object of this invention to provide such a system which provides faster gain recovery in the acquisition loop.

It is a further object of this invention to provide such a system which eliminates the need for sampling phase control circuits or timing recovery circuits during acquisition.

The invention results from the realization that a faster, simpler AGC gain recovery system, especially useful in data disc drive read circuits, can be effected by using in conjunction with a digital tracking-loop an analog acquisition loop which is shorter and therefore faster in adjusting the gain in response to a variation in the input signal and is simpler in that it requires no timing recovery or sampling phase control circuitry.

This invention features a hybrid analog/digital automatic gain control (AGC) gain recovery system. There is a variable gain amplifier (VGA) for receiving a variable amplitude analog input signal. A first digital AGC loop includes an analog to digital converter (ADC) for receiving the analog input signal and converting it to a digital signal. A digital gain error detection circuit detects variations of the digital signal in a first range and generates a digital error correction signal. A digital to analog converter (DAC) converts the digital error correction signal to a first analog correction signal. There is a second analog AGC loop including an analog gain error detection circuit responsive to variations in the output of the VGA in a second range greater than the first range for generating a second analog correction signal. An integrator circuit responsive to the first and second analog correction signal provides to the VGA a control signal to adjust the gain of the VGA to accommodate variations in the input signal amplitude.

In a preferred embodiment the first digital AGC loop may include a first filter device intermediate the VGA and ADC and there may be a second filter device intermediate the ADC and DAC. The analog gain error detection circuit may include an envelope detector for detecting the peak amplitude of the output of the VGA. It may also include a comparator circuit for determining whether the output of the VGA is in the second range. The comparator circuit may also include means for distinguishing a plurality of sub-ranges within the second range. The analog gain error detection circuit may include a voltage to current converter circuit. The integrator circuit may include a summing node for receiving the first and second analog correction signals and capacitor means connected to the summing node. The voltage to current converter circuit may include gain switching means for selecting a different gain for the voltage to current circuit for each of the sub-ranges. The DAC may include means for controlling the transfer function of the DAC in response to the digital error correction. The analog gain error correction circuit may generate the second analog correction signal only when the variations in the output of the VGA are in the second range. The digital gain error detection circuit may generate the first analog correction signal when the variations are in the first or second range.

DISCLOSURE OF PREFERRED EMBODIMENT

Figure 2:
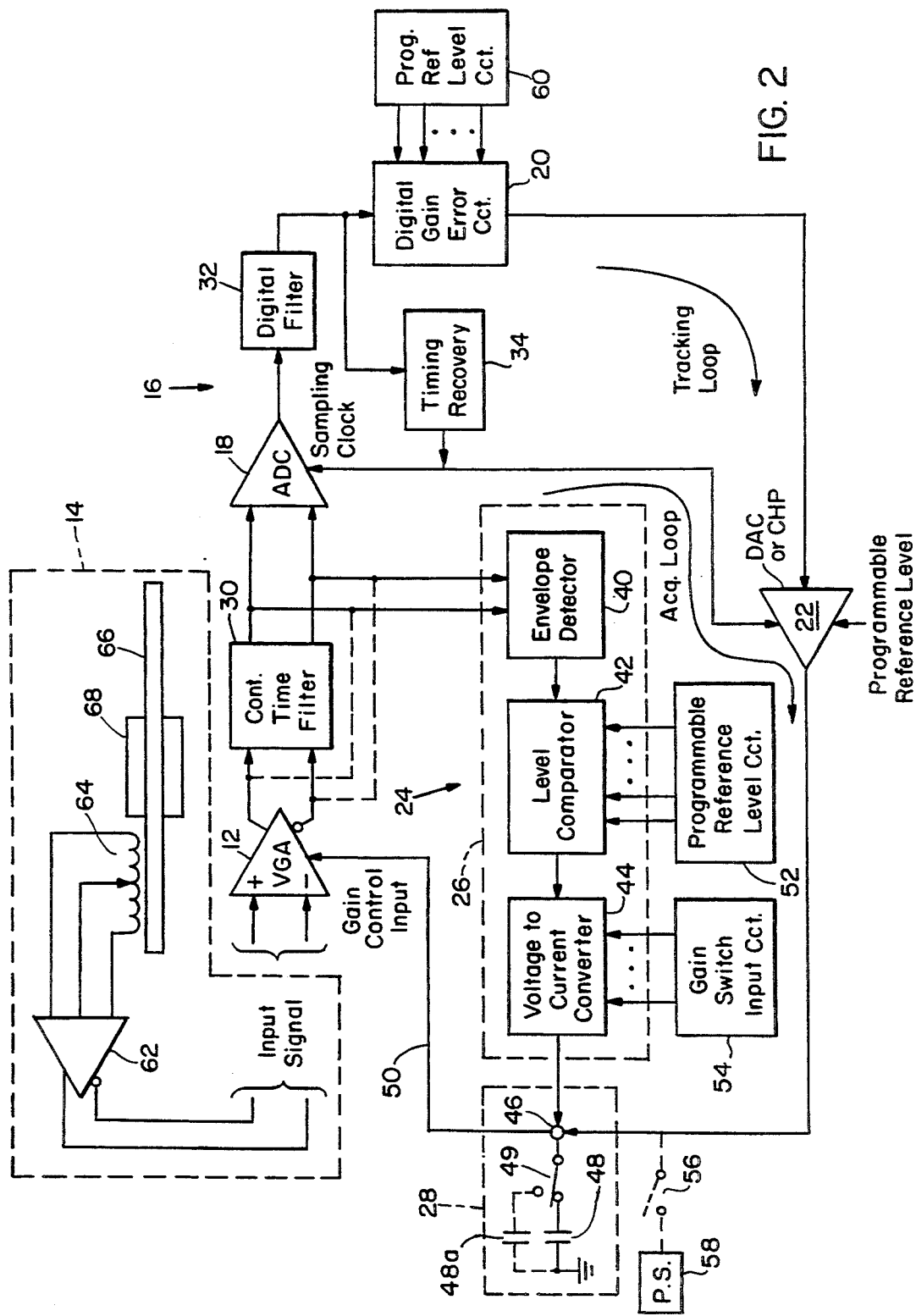

Other objects, features and advantages will occur to those skilled in the art from the following description of a preferred embodiment and the accompanying drawings, in which:

FIG. 1 is a schematic block diagram of a hybrid analog/digital automatic gain control gain recovery system according to this invention; and FIG. 2 is a more detailed schematic of the system of FIG. 1.

There is shown in FIG. 1 a hybrid analog/digital automatic gain control gain recovery system 10 according to this invention which includes a variable gain amplifier 12 that receives an input signal that tends to vary substantially, even by orders of magnitude such as a read signal which would be received from disc drive 14. System 10 includes two channels or loops. The first or tracking loop 16 is a digital automatic gain control (AGC) loop including analog to digital converter (ADC) 18, digital gain error circuit 20 and digital to analog converter (DAC) 22. The second acquisition channel or loop 24 is an analog AGC loop which includes analog gain error circuit 26. The output from DAC 22 in loop 16 and from analog gain error circuit 26 in loop 24 are both submitted to integrator circuit 28 whose output is connected to the control terminal of variable gain amplifier 12. In operation, as a varying analog input signal is delivered from disc drive 14 to VGA 12, VGA 12 produces an output to both ADC 18 and analog gain error circuit 26. ADC 18 converts the analog signal to a digital signal and delivers it to digital gain error circuit 20 which determines the deviation in the signal from a nominal point and provides an error signal representative of that deviation to DAC 22. DAC 22 converts the digital error signal from circuit 20 to an analog signal and provides it to integrator 28. Analog gain error circuit 26 responds to the output from variable gain amplifier 12, in a similar fashion to produce an error signal whenever the output of amplifier 12 deviates from an expected nominal value. The error signal from circuit 26 is also submitted to integrator 28. Integrator 28 receives either or both error signals from DAC 22 and circuit 26 and provides a control signal to amplifier 12 to adjust its gain so that the output signal from amplifier 12 is always within a nominal range suitable for most efficient use by ADC 18 and the remainder of the circuit regardless of the excursions of the input from disc drive 1,,. Typically loop 16, the tracking loop, adjusts for smaller deviations in the input signal and is operational most or all of the time, whereas the acquisition loop 24 operates only when the deviations are large to quickly bring the system back close to its nominal range where tracking loop 16 can operate to complete the adjustment. A sampling clock signal is provided to both DAC 22 and ADC 18 to ensure the time recovery or phase control.

In one implementation the output from variable gain amplifier 12, FIG. 2, may be submitted first to the continuous time filter 30 before it is submitted to ADC 18. Filter 30 may be a low pass filter which shapes and equalizes the signal. Another filter, digital filter 32, may also be provided in loop 16 between the output of ADC 18 and digital gain error circuit 20. Filter 32 has the same function as a low pass filter which also shapes and equalizes the signal. Tracking loop 16 also is shown to include timing recovery circuit 34 which adjusts the sampling phase of ADC 18 and DAC 22. Analog gain error circuit 26 of acquisition loop 24 includes envelope detector 40 which may be a rectifier and filter circuit that detects the d.c. envelope of the analog signal. Although the input to envelope detector 40 is shown coming from the output to filter 30, it may as well come directly from VGA 12. The d.c. level provided by envelope detector 40 is compared by the level comparators 42. If that value is significantly greater or less than a nominal value, e.g. 10%, then level comparators 42 provide a signal to voltage to current converter 44 for adjusting the gain of VGA 12. Voltage to current converter 44 responds to the voltage from level comparators 42 to produce a current at summing node 46 in integrator 28. The current is accumulated in capacitor 48 which is also included in integrator 28. The resultant voltage at node 46 constitutes the adjustment signal on lines 50 to VGA 12. Level comparators 42 may be programmed to recognize not just one range but a number of sub-ranges in that range through the use of programmable reference level circuit 52, and voltage to current converter 44 may be provided with a gain switch input circuit 54 through which the gain of converter 44 can be changed in correspondence with the changes in programmable reference levels 52 provided to level comparators 42. An additional capacitor 48a, shown in phantom, may be provided to store the integrated control voltage during servo feedback to determine read head position. A switch 49 may be provided to select the proper capacitor 48 or 48a for the particular mode of operation.

In operation, tracking loop 16, the fine adjustment loop, may be operational all the time while the acquisition loop 24 for coarse adjustment may be activated only when the deviation of the input signal is in a range which is greater than the range for which loop 16 is operational. Since the function of acquisition loop 24 is to make gross adjustments in response to gross deviations in the input signal, it does not matter that tracking loop 16 is operating at the same time that acquisition loop 24 is operating since the contribution of tracking loop 16 will be insignificant compared to that of loop 24. In certain instances it may be desirable to override both acquisition loop 24 and tracking loop 16 and force a control signal by closing switch 56 for example to provide a signal from power supply 58 directly on line 50 to the control input of VGA 12. Tracking loop 16 may also have a programmable reference level circuit 60 which adjusts the transfer function for digital gain error circuit 20 just as programmable reference level circuit 52 does for level comparators 42. Disc drive 14 may include a preamp 62 which receives the output from magnetic pickup 64 which reads from disc 66 driven by motor 68.

Although in the preferred embodiment disclosed herein the hybrid analog/digital automatic gain control gain recovery system is shown in conjunction with a data disc drive read device, this is not a necessary limitation of the invention as the system applies to control any variable gain amplifier which receives a variable amplitude analog input signal.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A hybrid analog/digital automatic gain control (AGC) gain recovery system comprising:
   a variable gain amplifier (VGA) for receiving a variable amplitude analog input signal;
   a first digital AGC loop including an analog to digital converter (ADC) for receiving an output of said VGA and converting it to a digital signal; a digital gain error detection circuit for detecting variations of said digital signal in a first range and generating a digital error correction signal; and a digital to analog converter (DAC) for converting said digital error correction signal to a first analog correction signal;
   a second analog AGC loop including an analog gain error detection circuit, responsive to variations in the output of said VGA in a second range greater than said first range, for generating a second analog correction signal; and
   an integrator circuit responsive to at least one of said first and second analog correction signals for providing to said VGA a control signal to adjust the gain of the VGA to accommodate variations in the input signal amplitude.

2. The hybrid analog/digital AGC gain recovery system of claim 1 in which said first digital AGC lop includes a first filter device intermediate said VGA and ADC.

3. The hybrid analog/digital gain recovery system of claim 2 in which said first digital AGC loop includes a second filter device intermediate said ADC and DAC.

4. The hybrid analog/digital gain recovery system of claim 1 in which said analog gain error detection circuit includes an envelope detector for detecting the peak amplitude of the output of said VGA.

5. The hybrid analog/digital gain recovery system of claim 1 in which said analog gain error detection circuit includes a comparator circuit for determining whether said output of said VGA is in said second range.

6. The hybrid analog/digital gain recovery system of claim 5 in which said comparator circuit includes means for distinguishing a plurality of sub-ranges within said second range.

7. The hybrid analog/digital gain recovery system of claim 1 in which said analog gain error detection circuit includes a voltage to current converter circuit.

8. The hybrid analog/digital gain recovery system of claim 7 in which said voltage to current converter circuit includes gain switching means for selecting a different gain for said voltage to current circuit for each of said sub-ranges.

9. The hybrid analog/digital gain recovery system of claim 1 in which said integrator circuit includes a summing node for receiving said first and second analog correction signals and capacitor means connected to said summing node.

10. The hybrid analog/digital gain recovery system of claim 1 in which said DAC includes means for controlling the transfer function of said DAC in response to said digital error correction signal.

11. The hybrid analog/digital gain recovery system of claim 1 in which said analog gain error detection circuit generates said second analog correction signal only when the variation in the output of said VGA are in said second range.

12. The hybrid analog/digital gain recovery system of claim 1 in which said digital gain error detection circuit generates said first analog correction signal when the variations are in the first or second range.

13. The hybrid analog/digital gain recovery system of claim 1 in which said integrator circuit includes a capacitor for storing a control signal to adjust the gain of said VGA to accommodate variations in the input signal amplitude during data readback.

14. The hybrid analog/digital gain recovery system of claim 1 in which said integrator circuit includes a pair of capacitors for storing a control signal to adjust the gain of said VGA to accommodate variations in the input signal amplitude during servo feedback and switch means for selecting one of said capacitors.

* * * * *